(12) United States Patent
Vimercati et al.

(10) Patent No.: US 12,293,783 B2
(45) Date of Patent: May 6, 2025

(54) VOLTAGE MANAGEMENT FOR IMPROVED tRP TIMING FOR FeRAM DEVICES

(71) Applicant: Micron Technology, Inc., Boise, ID (US)

(72) Inventors: Daniele Vimercati, El Dorado Hills, CA (US); Giovanni Mazzeo, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 197 days.

(21) Appl. No.: 17/829,054

(22) Filed: May 31, 2022

(65) Prior Publication Data

US 2023/0410871 A1 Dec. 21, 2023

(51) Int. Cl.
*G11C 11/22* (2006.01)

(52) U.S. Cl.
CPC ........ *G11C 11/2293* (2013.01); *G11C 11/221* (2013.01); *G11C 11/2273* (2013.01); *G11C 11/2275* (2013.01)

(58) Field of Classification Search
CPC G11C 11/221; G11C 11/2273; G11C 11/2275
USPC .................................................. 365/230.03
See application file for complete search history.

(56) References Cited

U.S. PATENT DOCUMENTS

| | | | | |
|---|---|---|---|---|
| 2003/0137866 A1* | 7/2003 | Nishihara | ............... | G11C 11/22 365/145 |
| 2004/0225829 A1* | 11/2004 | Akiyama | ............ | G06F 12/0864 711/E12.04 |
| 2005/0190597 A1* | 9/2005 | Kato | ....................... | G11C 11/22 365/185.08 |
| 2008/0025105 A1* | 1/2008 | Kang | ...................... | G11C 11/22 365/185.25 |
| 2018/0366174 A1* | 12/2018 | Liu | ........................ | H10B 53/10 |

* cited by examiner

*Primary Examiner* — Anthan Tran
(74) *Attorney, Agent, or Firm* — Fletcher Yoder, P.C.

(57) ABSTRACT

Systems and methods related to a memory device that includes a command interface configured to receive read commands and write commands to invoke read and write operations. The memory device also includes a memory bank having multiple memory cells implemented using ferroelectric layers between plate lines and digit lines. The memory device also includes bank control circuitry configured to control operation of the memory bank. The operation of the memory bank includes programming both high and low logic values as a write back to the multiple memory cells during a read and write phase where the read and write operations are performed after sensing values from the multiple memory cells.

22 Claims, 5 Drawing Sheets

VOLTAGE MANAGEMENT FOR IMPROVED tRP TIMING FOR FeRAM DEVICES

BACKGROUND

Field of the Present Disclosure

Embodiments of the present disclosure relate generally to memory devices. More specifically, embodiments of the present disclosure relate to monitoring operation of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The memory devices utilize sense amplifiers used by the memory device during read operations. Specifically, the read circuitry of the memory device utilizes the sense amplifiers to receive low voltage (e.g., low differential) signals and amplify the small voltage (e.g., voltage differences) to enable the memory device to interpret the data properly. However, some embodiments of the sense amplifiers consume excess resources (e.g., power and/or area). Furthermore, some sense amplifiers have to perform operations within specified timing restraints that may be more difficult to meet for some technologies (e.g., FeRAM) without adjustments to current operation.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

FeRAM memory technology utilization is increasing due to various possible market directions. As discussed, below FeRAM may be implemented with a one-transistor, one-capacitor (1T1C) per cell or two-transistor, two-capacitor (2T2C) per cell arrangements. In the 2T2C arrangement, two cells are used for a single bit of data. One cell stores the data while another cell stores the complement of the data. The first cell is coupled to a digit line (DL) while the second is coupled to a digit line bar/false (DLB). A sense amplifier receives both signals from the DL and the DLB as a differential signal.

As discussed below, the 1T1C arrangement understandably uses less space than the 2T2C arrangement. However, the 2T2C accommodates faster speeds that may be used to obtain performances close or the same as DRAM specification requirements to enable the FeRAM to be compliant with DRAM specifications in dedicated FeRAM devices or hybrid DRAM/FeRAM devices. Thus, timing of various FeRAM operations may be important to comply with DRAM specified timings.

Furthermore, like DRAM, FeRAM utilizes a memory restore to restore memory values from latches back to the memory cells after a read. Specifically, each cell is programmed "0" then cells that previously stored a "1" are programmed as such from the latches. Such programming of 1s may be conducted after writes are completed and may consume important time that is to be streamlined to comply with DRAM requirements.

Figure 1:
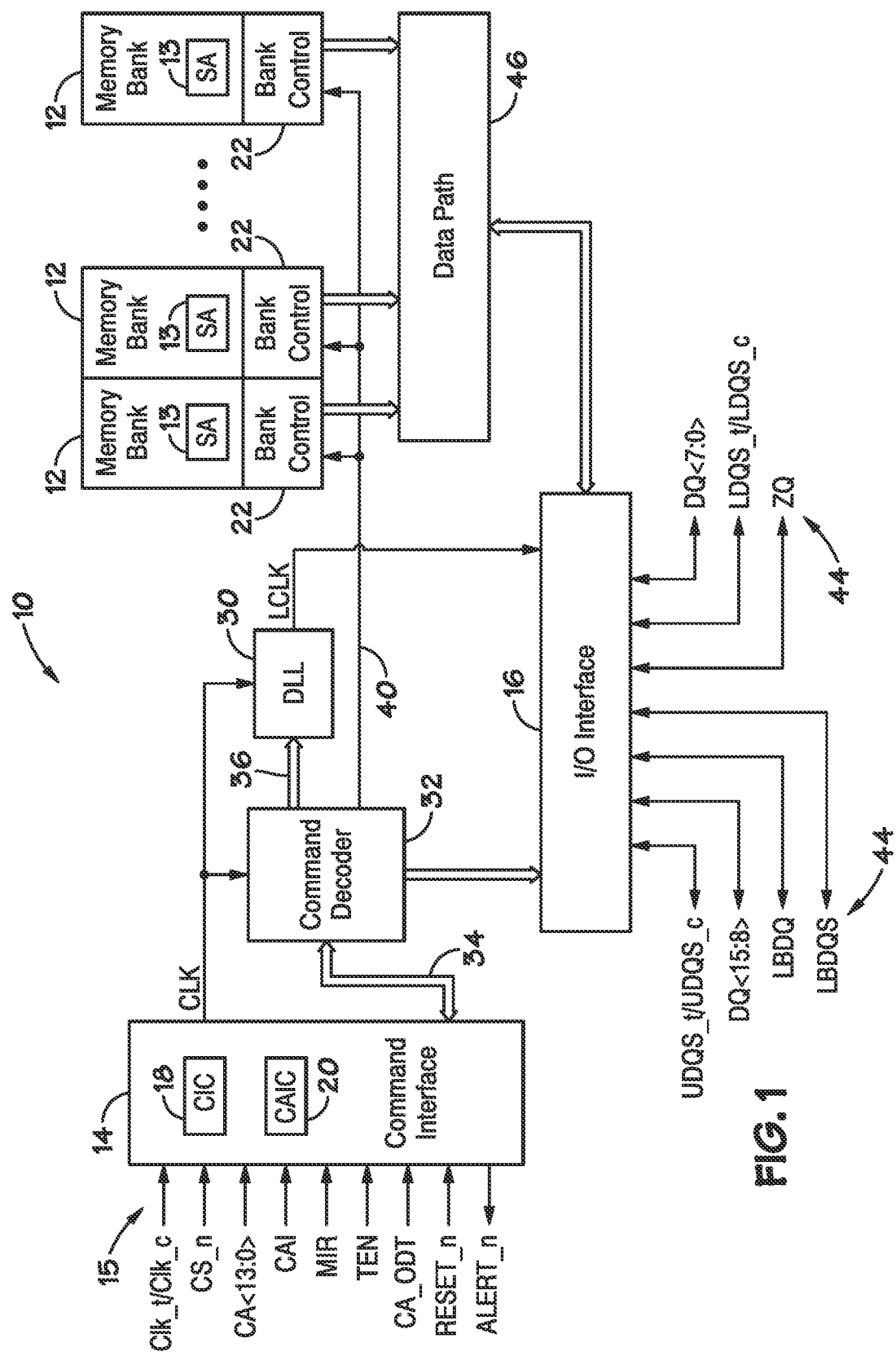
FIG. 1 is a simplified block diagram illustrating certain features of a memory device having sense amplifiers and memory cells, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device, a ferroelectric memory (FeRAM) device, or a hybrid combination thereof. Various features of memory device 10 allow for reduced power consumption, more bandwidth and more storage capacity compared to prior generations of DDR SDRAM.

The memory device 10 may include a number of memory banks 12. The memory banks 12 may be DDR5 SDRAM memory banks, FeRAM memory banks, or both, for instance. The memory banks 12 may be provided on one or more chips (e.g., SDRAM and FeRAM chips) that are arranged on dual inline memory modules (DIMMS). Each DIMM may include a number of memory chips (e.g., x8 or x16 memory chips), as will be appreciated. Each memory chip may include one or more memory banks 12. The memory device 10 represents a portion of a single memory chip having a number of memory banks 12. The memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
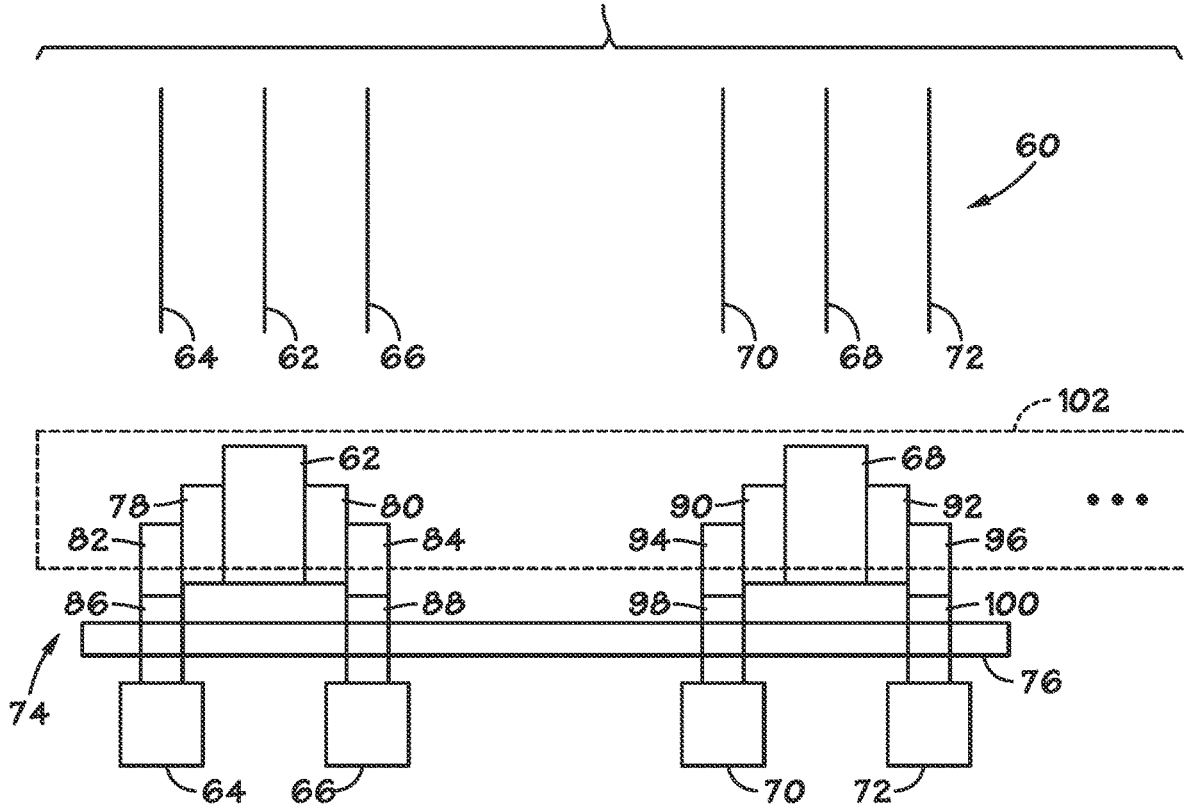
FIG. 2 is a top view of lines of ferroelectric memory cells of FIG. 1 and a side view of the lines in the memory cells of FIG. 1, according to an embodiment of the present disclosure.

FIG. 2 is a top view 60 of lines of ferroelectric memory cells of FIG. 1 and a side view 74 of the lines in the memory cells of FIG. 1 with additional connections. As illustrated, a ferroelectric memory device (e.g., memory device 10) may utilize a plate line (PL) 62 that provides a plate voltage to multiple cells in a row/column. Each PL is flanked by two digit lines that are utilized for cells connected to the respective PL. For instance, the PL 62 is flanked by DL 64 and DLB 66 at each cell in along the PL 62. Similarly, other plate lines may be used for other cells in other rows/columns. For instance, PL 68 may be flanked by DL 70 and DLB 72.

In the side view 74, the PLs 62 and 68 utilize a wordline (WL) 76 to control access to respective cells. As illustrated, the PL 62 is sandwiched between ferroelectric layers 78 and 80. The ferroelectric layers 78 and 80 are adjacent to opposite sides of the PL 62. For instance, the ferroelectric layers 78 and 80 may be formed from ferroelectric oxides, lead zirconium titanate, and/or other materials that have ferroelectric properties. Opposite the sides of the ferroelectric layers 78 and 80 coupled to and adjacent to the PL 62, the ferroelectric layers 78 and 80 are coupled to conductors 82 and 84 that may be extensions of source or drain terminals of respective selectors 86 and 88. The selectors 86 and 88 may be thin-film transistors (TFTs) or other low-voltage (LV) transistors that may have better matching characteristics (e.g., threshold voltages (VTH)) between transistors at low voltages. As previously noted, these transistors may have a maximum biasing voltage (e.g., 1.2 V) that is lower than a nominal program voltage (e.g., 1.5 V) for FeRAM. Instead, as discussed below, a write back circuit that works with higher voltages may be used to write back to the DL 64 and/or the DLB 66. The ferroelectric layer 78 connected to the PL 62 and the conductor 82 form a first cell while the ferroelectric layer 80 connected to the PL 62 and the conductor 84 form a second cell. The selectors 86 and 88 select the respective cells using the WL 76.

Similarly, the PL 68 is sandwiched between ferroelectric layers 90 and 92 with the ferroelectric layers 90 and 92 adjacent to opposite sides of the PL 68. Like the ferroelectric layers 78 and 80, the ferroelectric layers 90 and 92 may be formed from ferroelectric oxides, lead zirconium titanate, and/or other materials that have ferroelectric properties. Opposite the sides of the ferroelectric layers 90 and 92 coupled to and adjacent to the PL 68, the ferroelectric layers 90 and 92 are coupled to conductors 94 and 96 that may be extensions of source or drain terminals of respective selectors 98 and 100. The selectors 98 and 100 may be of the same type, materials, and/or characteristics as the selectors 86 and 88. The ferroelectric layer 90 connected to the PL 68 and the conductor 94 form a first cell while the ferroelectric layer 92 connected to the PL 68 and the conductor 96 form a second cell. The selectors 98 and 100 select the respective cells using the WL 76.

Although the foregoing discusses using a PL for the cells. However, in some embodiments, at least two of the PLs (e.g., PL 62 and 68) may be merged into a single plate 102 shared between at least 4 digit lines (e.g., DL 64, DLB 66, DL 70, and DLB 72).

Figure 3:
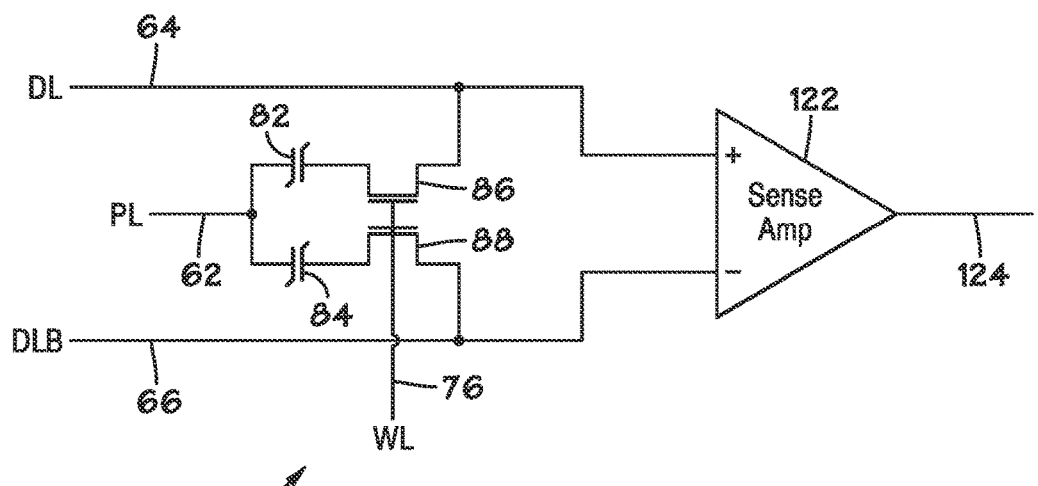
FIG. 3 is a circuit diagram of a connection of the lines of FIG. 2 to a sense amplifier of FIG. 3, according to an embodiment of the present disclosure.

FIG. 3 is a circuit diagram of a connection 120 of the PL 62 through ferroelectric layers 78 and 80 via selectors 86 and 88 to the DL 64 and the DLB 66, respectively. The DL 64 and the DLB 66 are received at a sense amplifier 122 as a differential signal. The sense amplifier 122 may be one of the sense amplifiers 13 of FIG. 1. The sense amplifier 122 utilizes this differential signal to output a value 124. In some embodiments, the sense amplifier 122 may also send a complementary value along with the value 124.

Figure 4:
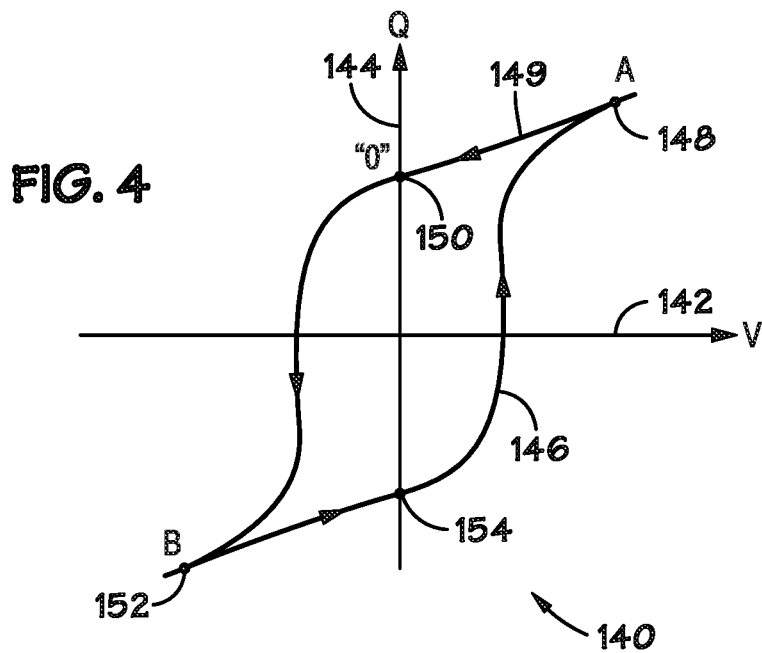
FIG. 4 is a graph of a ferroelectric characteristic of the memory cell of FIGS. 2 and 3, according to an embodiment of the present disclosure.

FIG. 4 is a graph 140 of a ferroelectric characteristic of the ferroelectric layers 78, 80, 90, and 92. The graph 140 plots the voltage (V) 142 applied across the ferroelectric layer/capacitor and the charge (Q) 144 in the ferroelectric layer/capacitor. The voltage is increased in a positive direction across the ferroelectric layer/capacitor along line 146 until a point A 148 is reached. After the point A 148 is reached, when the voltage is removed (e.g., returns to 0V), the charge decreases along line 149 until it settles at a point 150 that is deemed a first logic value (e.g., "0"). If the voltage across the ferroelectric layer/capacitor is made more negative, the charge continues decreasing along line 149 until a point B 152 is reached. After the point B 152 has been reached, a removal or increase of the voltage causes the charge to increase again along the line 146. If the voltage is removed (e.g., 0V), the charge settles to a point 154 that is deemed a second logic value (e.g., "1"). Although the illustrated logic values have inverse relationships with the amount of charge in the ferroelectric layer/capacitor, in some embodiments, the assignment of the logic values may be reversed to have a direct relationship with the amount of charge in the ferroelectric layer/capacitor.

Figure 5:
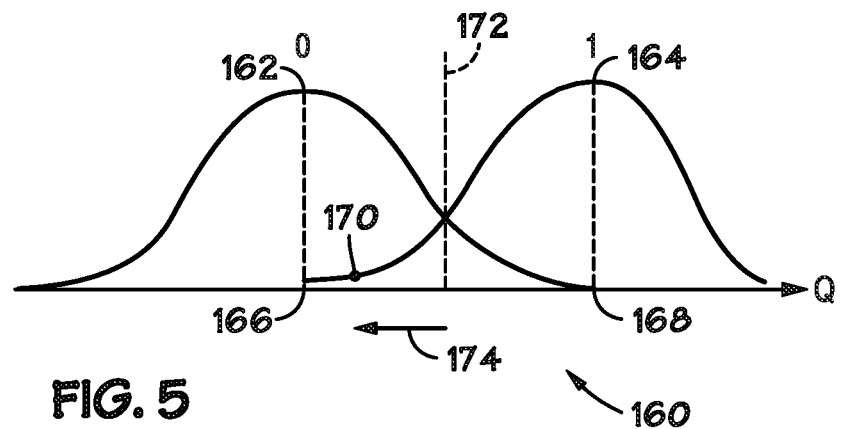
FIG. 5 is a graph of distributions of different logic levels for a one-transistor one-capacitor memory cell arrangement, according to an embodiment of the present disclosure.

As previously discussed, memory devices (e.g., FeRAM) may be implemented using 1T1C or 2T2C configurations. FIG. 5 shows a graph 160 showing distribution curves 162 and 164 reflecting possible charges for a "0" charge 166 and for a "1" charge 168 along respective Gaussian curves 162 and 164 for a 1T1C deployment. The memory device 10 may utilize a reference voltage 172 to interpret whether the charge is indicative of a "1" or a "0." However, as illustrated, there is a probability that a charge 170 along the curve 164 indicative of a "1" may be improperly interpreted as a "0" due to the amount of charge 170 being in a direction 174 (e.g., less than) relative to the reference voltage 172.

Figure 6:
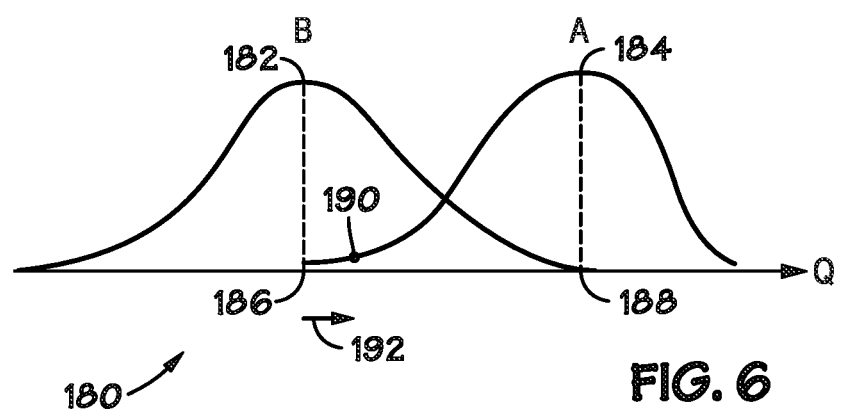
FIG. 6 is a graph of distributions of different charges for a two-transistor two-capacitor memory cell arrangement, according to an embodiment of the present disclosure.

As previously discussed, in addition or alternative to the 1T1C configuration, the memory device 10 may utilize a 2T2C configuration. FIG. 6 shows a graph 180 showing distribution curves 182 and 184 reflecting possible charges for a first charge 186 and for a second charge 188 along respective Gaussian curves 182 and 184 for a 2T2C deployment. Instead of using the reference voltage 172 to interpret whether the charge is indicative of a "1" or a "0," the charges may be subtracted from each other (e.g., A–B) to determine a differential signal. Thus, the probability that a charge 190 along the curve 184 may be improperly interpreted is reduced. The direction 192 from the first charge 186 is in the correct direction increasing the likelihood that the final result is interpreted properly.

In other words, 2T2C implementations provide a higher probability of a correct interpretation and provides faster speeds. However, the 2T2C implementation consumes more resources regarding financial costs, power costs, and area costs. The decision to use 1T1C and 2T2C may vary based on particular use cases.

Figure 7:
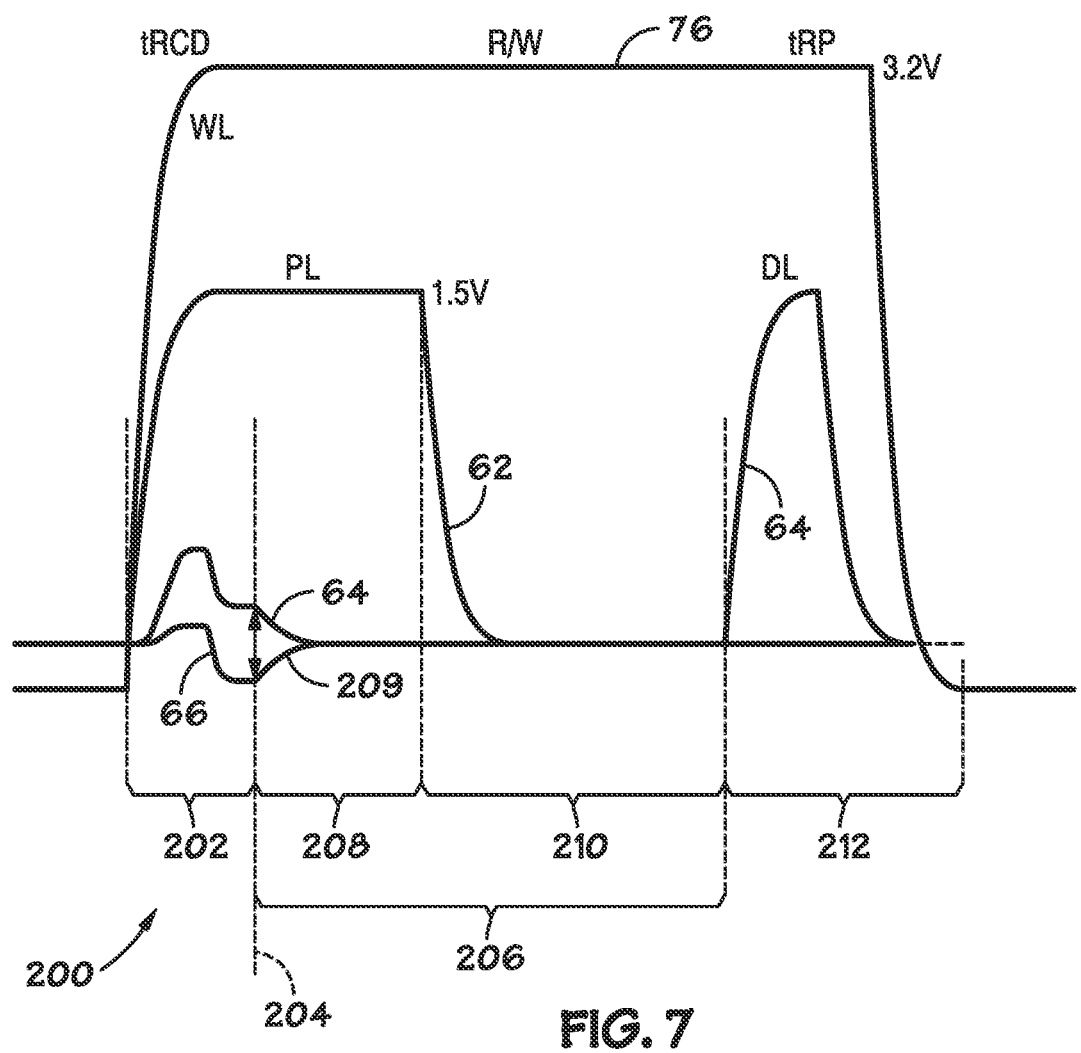
FIG. 7 is a graph for a potential implementation for operating cells in the memory array of FIG. 1 corresponding to the sense amplifier of FIG. 3, according to an embodiment of the present disclosure.

FIG. 7 is a graph 200 of a possible implementation for operating the memory cells of the memory device 10. As illustrated, the graph 200 includes three phases: a tRCD phase 202, a read/write (R/W) phase 206, and a tRP phase 208. The tRCD phase 202 is the phase that corresponds to the tRCD or timing to open and sense memory cell(s) where the value of the cell(s) is to be stored the sense amplifier latches. For example, in a 2T2C configuration, both memory cells are opened and read while a single cell may be read for a 1T1C configuration. At the beginning of the tRCD phase 202, the WL 76 and the PL 62 transition to a WL voltage (e.g., 3.2V) and a nominal voltage (e.g., 1.5V), respectively. As illustrated, during this phase, the DL 64 (and the DLB 66) is connected to the memory cell causing the memory cells to discharge to the DL 64 (and the DLB 66). These charges are also transmitted to the sense amplifier 122 via the DL 64 (and the DLB 66) where the voltage (e.g., voltage difference between charges from the DL 64 and the DLB 66 for 2T2C) is amplified in and latched in the sense amplifier 122.

The R/W phase 206 corresponds to time where the read operations and write operations may be made for the memory cell(s). Specifically, the data may be read from via the sense amplifier 122 and/or write values may be received via the command interface 14. Since reads of a FeRAM memory cell is disruptive and is to be restored, all of the FeRAM memory cells may be programmed to "0" during a sub-phase 208 of the R/W phase 206. However, the data from the memory cells is not lost as the data is latched to the sense amplifiers 13 (e.g., sense amplifier 122) prior to programming the memory cells to "0." To ensure that the latching is completed before programming "0s," the programming of "0s" may be delayed until time 209 after the beginning of the R/W phase 206 to allow the DL 64 (and the DLB 66) to settle back to a programming level (e.g., 0.0V) after latching. Furthermore, the PL 62 may be allowed to settle back to 0.0V after the programming of "0s." However, the PL 62 may be held for some additional period after time 209 to make sure that the programming of the "0s" has enough time since the programming of the memory cells utilizes the PL 62 and the DL 64 (or the DLB 66). After this extra time, the PL 62 may revert to 0.0V with read operations and write operations still allowed to continue during a sub-phase 210 of the R/W phase 206.

After the R/W phase 206, a tRP phase 212 may begin. The tRP indicates the time used to tell the memory chip to close a page and precharge the components back to enable a next memory operation to be applied. In the illustrated tRP phase 212, the DL 64 (or the DLB 66) is raised to the nominal voltage (e.g., 1.5V) while the PL 62 remains at 0.0V. This reversal of voltages between the PL 62 and the DL 64 causes a "1" to be programmed to the memory cells that have a corresponding logic high value latched in the sense amplifier 122 during the tRCD phase 202. The reason that the programming of "1s" is delayed until the tRP phase 212 is that the value to be restored/written to the memory cells is not known until the write operations have been completed thereby waiting until the last write command of the cycle has been completed before programming the "1s." However, this delay may cause the tRP phase 212 to be exceedingly long (e.g., 40 ns) relative to a specification value. For instance, the specification for DRAM devices defines tRP as 18 ns causing FeRAM devices to be incompatible with devices using the DRAM specification for timings.

Figure 8:
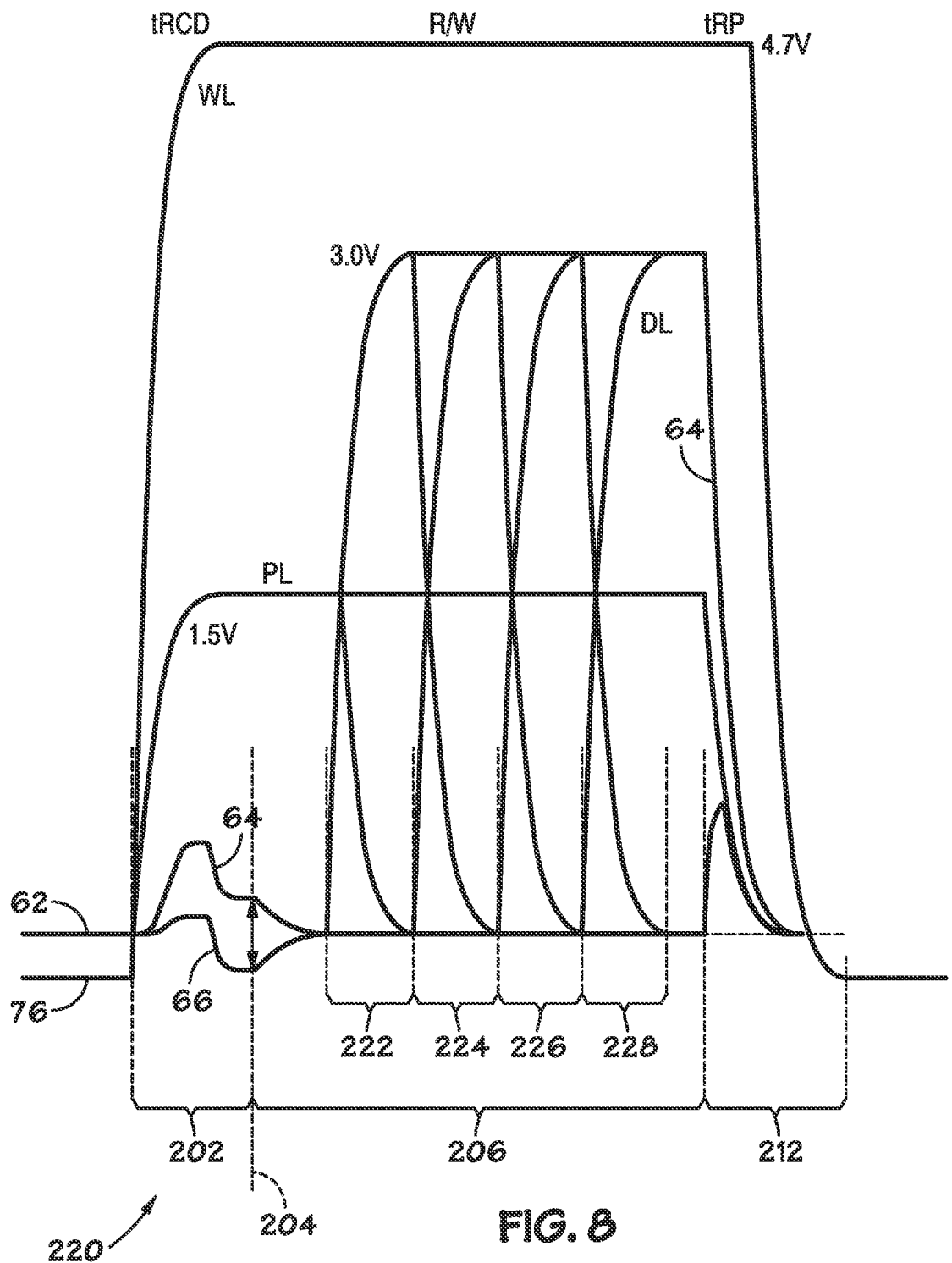
FIG. 8 is a graph for an alternative implementation for operating cells in the memory array of FIG. 1 corresponding to the sense amplifier of FIG. 3, according to an embodiment of the present disclosure.

To reduce this discrepancy between the definition for tRP in DRAM specifications and in FeRAM devices, the programming of "1s" may be moved to the R/W phase 206 by enabling the DL (and DLB 66 in 2T2C implementations) to swing to 2× (e.g., 3.0V) the nominal voltage (e.g., 1.5V) as illustrated in a graph 220 depicted in FIG. 8. The graph 220 depicts an alternative method to operate the memory device 10 to program "0s" and "1s." Like the graph 200, the graph 220 shows sensing and latching of the memory cells in the sense amplifier 122 during the tRCD phase 202. However, the graph 220 has no separate programming of "0s" in the sub-phase 208. Instead, the graph 220 shows programming of "1s" and "0s" using the swinging of the DL 64 above or below the PL 62 while the PL 62 remains at the nominal voltage (e.g., 1.5V). In other words, the voltage across the cell may be set to the nominal voltage (e.g., 1.5V) with different polarities depending on whether the DL 64 is a first voltage (e.g., 0.0) or a second voltage (e.g., 3.0V) that is 2× of the nominal voltage. Since the DL 3.0V moves to a higher voltage, the WL 76 also operates at a higher voltage (e.g., 4.7V rather than the 3.2V in the graph 200).

Enabling programming of "1s" and "0s" during read and write operations, the appearance of the curve for the DL 64 depending on what user data is to be written in programming sub-phases 222, 224, 226, and 228. Although four sub-phases 222, 224, 226, and 228 are illustrated, any number of "1s" or "0s" may be written during the R/W phase 206. For instance, as an example, the memory device 10 senses values of "1101" from the memory cells, but the host device/user is writing in new values of "1000." During the programming sub-phase 222, the DL 64 may move to a high voltage (e.g., 3.0V) causing a "1" to be programmed to the corresponding memory cells. During, the programming sub-phases 224, 226, and 228, the DL 64 may move to a low voltage (e.g., 0.0V) to cause the corresponding memory cells to be programmed with "0s." In some embodiments, all memory cells may be programmed to a default value (e.g., "0") first before programming the other value.

As illustrated, the PL 62 increases in the tRCD phase 202. In some embodiments, the voltage of the PL 62 may be fixed to the nominal voltage as a fixed voltage. However, the PL 62 and DL 64 are to be the same voltage during idle states. Accordingly, at the beginning of sensing and to accommodate a fixed PL 62, the tRCD 202 would be extended to enable the DL 64 to drop to 0.0V before sensing begins when the WL 76 is increased. This enables simplicity of the PL 62 but increases the complexity of driving the DL 64 and the time used to complete tRCD.

Furthermore, by enabling the memory device to program both "0s" and "1s" during the R/W phase 206 while read and write operations are completed, the duration of the tRP may be greatly reduced and brought near or within DRAM tRP requirements to increase compatibility between FeRAM memory and devices using DRAM memory specifications. Thus, although the power consumption in the memory device 10 is increased due to the larger voltage swing of the DL 64, the WL 76, and column decoder selectors, the benefit of a faster tRP may offset such costs. By shifting the programming of "0s" and "1s" to the tRCD phase 202, FeRAM-implemented memory banks may function within or near to DRAM specification even though DRAM devices may have relatively longer write recovery time (tWR) periods due to DRAM devices programming their cells during the tWR periods. Thus, even though FeRAM devices may program during the R/W phase 206 (instead of the tWR period like the DRAM devices), the tRP phase 212 is not overly impacted like the implementation as shown in the graph 200.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
a command interface configured to receive read commands and write commands to invoke read and write operations;
a memory bank comprising a plurality of memory cells implemented using ferroelectric layers between plate lines and digit lines; and
bank control circuitry configured to control operation of the memory bank, wherein the operation of the memory bank comprises programming both high and low logic values as a write back to the plurality of memory cells during a read and write phase where the read and write operations are performed after sensing values from the plurality of memory cells, wherein a plate voltage of a plate line of the plate lines is maintained at a constant voltage from the sensing through programming both the high and low logic values in a same period with a constant voltage of a wordline by swinging the digit lines alternatingly between a maximum voltage and a minimum voltage during the same period, wherein the constant voltage is between the maximum voltage and the minimum voltage of the digit lines during the programming of the high and low logic values.

2. The memory device of claim 1, wherein the memory bank comprises:
a plurality of plate lines each corresponding to two memory cells; and
a plurality of digit lines each corresponding to a respective memory cell.

3. The memory device of claim 2, wherein each bit of data to be stored in the memory bank is stored as complementary data in two different memory cells.

4. The memory device of claim 2, wherein each bit of data to be stored in the memory bank is stored in a single memory cell.

5. The memory device of claim 1, wherein the constant voltage is a nominal voltage for ferroelectric-based memory cells.

6. The memory device of claim 1, wherein the bank control circuitry is configured to receive a write command from the command interface during the read and write phase and programming a corresponding memory cell of the plurality of memory cells with a value from the write command during the read and write phase.

7. The memory device of claim 1, comprising a plurality of sense amplifiers configured to sense stored charges of the memory cells during a tRCD phase that has a defined duration to open a cell and the sensing occurs at the end of the tRCD phase.

8. The memory device of claim 7, wherein the voltage of the plate line and the voltage of a wordline both increase during the tRCD phase to levels that are constant through the read and write phase.

9. The memory device of claim 8, wherein a tRP phase occurs after the read and write phase, the tRP phase has a defined duration to close a page of memory, and no programming of high or low logic values is performed during the tRP phase.

10. The memory device of claim 9, wherein the voltage of the wordline and the voltage of the plate line decrease to idle values during the tRP phase.

11. The memory device of claim 1, wherein the maximum voltage of the digit lines during the programming of the high and low logic values is 3.0V, the minimum voltage for the digit lines during the programming of the high and low logic values is 0V, and the constant voltage is 1.5V.

12. The memory device of claim 1, wherein a plurality of digit lines of the digit lines is used to perform reprogramming using a single plate line.

13. The memory device of claim 11, wherein the constant voltage of the wordline during the same period is 4.7V.

14. A memory device, comprising:
a plate line;
a ferroelectric layer implementing a memory cell and coupled to the plate line;
digit lines coupled to the ferroelectric layer;
a sense amplifier coupled to the digit lines and configured to sense and amplify a voltage received at the digit lines from the memory cell; and
bank control circuitry configured to program a logic high value back to the memory cell after sensing the voltage in the sense amplifier and to program a logic low value back to memory cell after sensing a low value in the sense amplifier, wherein writing back the logic high value or the logic low value occurs while reading and writing operations are performed during a read and write phase of operation, wherein a plate voltage of the plate line is maintained at a constant voltage from the sensing through programming both the logic high and logic low values to corresponding memory cells in a same period with a constant voltage of a wordline by swinging the digit lines alternatingly between a maximum voltage and minimum voltage during the same period, wherein the constant voltage is between the maximum voltage and the minimum voltage of the digit lines during the programming of the logic high and logic low values.

15. The memory device of claim 14, wherein the bank control circuitry is configured to maintain the voltage of the plate line at a nominal voltage during the read and write phase.

16. The memory device of claim 14, wherein the maximum voltage of the digit lines during the programming of the high and low logic values is 3.0V, the minimum voltage for the digit lines during the programming of the high and low logic values is 0V, and the constant voltage is 1.5V.

17. The memory device of claim 14, wherein a plurality of digit lines of the digit lines is used to perform reprogramming using a single plate line.

18. The memory device of claim 16, wherein the constant voltage of the wordline during the same period is 4.7V.

19. A method comprising:
sensing a stored value stored in a ferroelectric memory cell of a memory device using a sense amplifier; and
programming the memory cell to a logic high value during a read and write phase where read and write operations are being performed for the memory device, programming a logic low value to the memory cell during the read and write phase, wherein programming the memory cells comprises maintaining a plate voltage of a plate line at a constant voltage from a sensing phase through programming both the logic high value and the logic low value in a same period with a constant voltage of a wordline by swinging digit lines alternatingly between a maximum voltage and a minimum voltage during the same period, wherein the constant voltage is between the maximum voltage and the minimum voltage of the digit lines during the programming of the logic high value and logic low value.

20. The method of claim 19, wherein the maximum voltage of the digit lines during the programming of the high logic value and the low logic values is 3.0 V, the minimum voltage for the digit lines during the programming the high logic value and the low logic values is 0V, and the constant voltage is 1.5V.

21. The method of claim 19, wherein programming the logic low value and programming the logic high value for multiple digit lines including the digit lines comprises utilizes the plate line as a single plate line.

22. The method of claim 20, wherein the constant voltage of the wordline during the same period is 4.7V.

* * * * *